United States Patent [19]

Spellman et al.

[11] 4,268,846

[45] May 19, 1981

[54] INTEGRATED GATE TURN-OFF DEVICE WITH LATERAL REGENERATIVE PORTION AND VERTICAL NON-REGENERATIVE POWER PORTION

[75] Inventors: Gordon B. Spellman, Mequon; Herman P. Schutten, Elm Grove; Stanley V. Jaskolski, Sussex, all of Wis.

[73] Assignee: Eaton Corporation, Cleveland, Ohio

[21] Appl. No.: 972,506

[22] Filed: Dec. 22, 1978

[51] Int. Cl.³ .............................................. H01L 29/74
[52] U.S. Cl. ....................................... 357/38; 357/35; 307/252 A; 307/252 C; 307/252 K
[58] Field of Search ............... 357/38, 35; 307/252 A, 307/252 C, 252 K

[56] References Cited

U.S. PATENT DOCUMENTS

| | | | |
|---|---|---|---|
| 3,265,909 | 8/1966 | Gentry | 357/38 |
| 3,979,766 | 9/1976 | Tsuyuki | 357/38 |
| 4,015,143 | 3/1977 | Tokunaga et al. | 307/252 A |
| 4,112,315 | 9/1978 | Ohhinata | 307/252 A |
| 4,125,787 | 11/1978 | Ohhinata et al. | 307/252 A |

Primary Examiner—Joseph E. Clawson, Jr.
Attorney, Agent, or Firm—R. J. McCloskey; H. R. Rather; M. L. Union

[57] ABSTRACT

A gate turn-off device is formed by the integration of a lateral SCR and a vertical power transistor operating in parallel, with the latter carrying most of the load current whereby the former may be easily turned off which in turn terminates base drive to the transistor and thus the device is turned OFF.

3 Claims, 2 Drawing Figures

INTEGRATED GATE TURN-OFF DEVICE WITH LATERAL REGENERATIVE PORTION AND VERTICAL NON-REGENERATIVE POWER PORTION

BACKGROUND OF THE INVENTION

Gate turn-off devices are known in the art. Generally, a thyristor can be turned on with a small gating signal of one polarity, say positive. Since a thyristor is a regenerative element, it will stay conductive above a certain minimum holding current flowing between its main terminals, even if gate drive is removed. Such thyristor can be turned off by a negative gating signal. For low level conduction current through the thyristor, say only slightly above the minimum holding current, only a small negative gating signal is necessary to turn it off. However, when the thyristor is conducting heavily with a high amount of current flow therethrough, turn-off is difficult or impossible and requires a substantially larger negative gating signal.

Numerous schemes are known for accomplishing turn-off. One approach is to supply the requisite high level off signal by means of a short duration, high level pulse, for example by capacitor discharge.

Another approach is to attack the problem from a different angle and attempt to reduce the requisite magnitude of the off signal necessary to achieve turn-off. For example, rather than using a thyristor alone as the power switching element, it is instead used as a low level regeneration element to control a non-regenerative power element (i.e. continual gating or driving current is necessary to maintain conduction). The thyristor is connected to drive the power element into conduction such that the latter carries load current and the thyristor carries only a small on current which is above its minimum holding value and which is also above the minimum driving current necessary to maintain continued conduction of the power element. It is thus generally known to employ the combination of a low level regeneration element controlling a high current capacity non-regenerative element in order to achieve high turn-off gain by breaking the regenerative loop with a low level signal.

The integration of a vertical SCR and a vertical power transistor is known. The SCR and the transistor operate in parallel with the transistor carrying most of the load current. The base region of the transistor is common with one of the interior regions of the SCR, whereby when the SCR is conductive, there is supplied base drive to the transistor and the latter conducts. Since only a low level current flows through the SCR, it is easily turned off by a negative gating signal, which breaks the regenerative loop, thus terminating base drive for the transistor and the device is turned off.

SUMMARY OF THE INVENTION

The present invention relates to improvements in gate turn-off devices of the type having an SCR integrated with a power transistor and operated in parallel therewith and controlling the base drive therefor, and is directed to the integration of lateral regenerative means with vertical non-regenerative power means.

The integrated configuration preferably includes: a lateral SCR for better gate region access; resistance formed by the lateral dimension of the SCR cathode emitter region to force most of the load current to flow through the power transistor in the other circuit branch, keeping the SCR in the low current range where it is relatively easy to turn off; a vertical power transistor and a reverse blocking vertical diode in series therewith; and an N+ epi substrate material between the transistor and the diode to enable low transistor saturation resistance while also blocking vertical SCR action due to the low minority carrier lifetime in the N+ region.

DESCRIPTION OF THE PREFERRED EMBODIMENT

Figure 1:
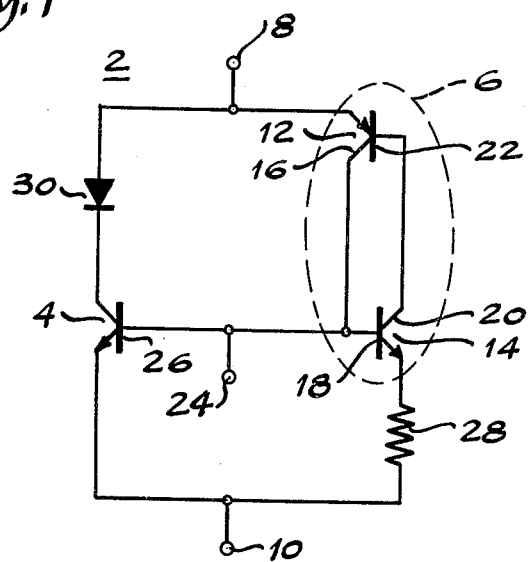
FIG. 1 is a circuit diagram of a gate turn-off device constructed in accordance with the invention.
Figure 2:
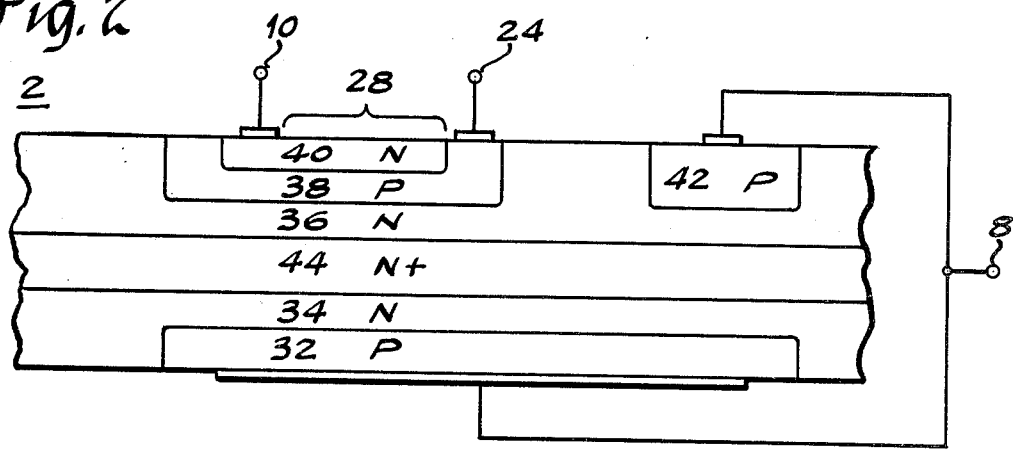
FIG. 2 is a substrate diagram showing the integrated configuration of a gate turn-off device constructed in accordance with the invention.

FIGS. 1 and 2 show a gate turn-off device generally designated by the reference character 2. Referring to FIG. 1, an NPN power transistor 4 is connected in parallel with SCR 6 across main anode terminal 8 and main cathode terminal 10 carrying load current. The SCR comprises a pair of composite transistors, PNP transistor 12 and NPN transistor 14. The collector 16 of transistor 12 is connected to the base 18 of transistor 14, and the collector 20 of transistor 14 is connected to the base 22 of transistor 12, thus forming a regenerative loop to enable SCR action. A positive gating signal applied to control terminal 24 drives base 18, rendering transistor 14 conductive which in turn draws current out of base 22 thereby rendering transistor 12 conductive whereby current flows through collector 16 to base 18 thus forming a regenerative loop which sustains conduction after removal of the signal from terminal 24.

Some of the positive signal current applied at gate terminal 24 flows to the base 26 of power transistor 4 rendering the latter conductive. Removal of the signal current from terminal 24 does not render power transistor 4 non-conductive because some of the regenerative loop current from collector 16 flows to base 26 thus sustaining conduction of power transistor 4. Resistance 28 in series with SCR 6 forces most of the load current between terminals 8 and 10 to flow in the other parallel circuit branch through series aiding diode 30 and power transistor 4. There is thus only a low level current flow through SCR 6 and hence the SCR may be easily turned off by a small negative signal on terminal 24. With the SCR off, no current flows from collector 16 to base 26 and hence power transistor 4 is non-conductive and device 2 is thus OFF.

The substrate drawing of FIG. 2 shows the structure of the integrated configuration. P region 32 and N region 34 form diode 30. Power transistor 4 is formed by N region 36, P region 38 and N region 40, forming collector, base and emitter, respectively. SCR 6 is formed by P region 42, N region 36, P region 38 and N region 40; regions 42, 36 and 38 form emitter, base and collector, respectively, of composite PNP transistor 12 of FIG. 1, and regions 36, 38 and 40 form collector, base and emitter, respectively, of composite NPN transistor 14 of FIG. 1. Resistance 28 of FIG. 1 is formed by the lateral dimension of N region 40. N+ region 44 enables low saturation resistance for power transistor 4, and also prevents vertical SCR action between diode 30 and transistor 4 due to the low minority carrier lifetime in the N+ region. There is thus provided a vertical power transistor and a lateral SCR integrated on a common substrate, and sharing three common active regions 36, 38 and 40.

Power transistor 4 is vertical for high current capacity, and SCR 6 is lateral for easy access and terminal connection purposes.

What is claimed is:

1. A monolithically integrated gate turn-off device comprising:

a pair of main terminals for carrying load current;

a control terminal which enables said device to be turned ON by signal current of one polarity, and be turned OFF by signal current of the opposite polarity;

non-regenerative switching means formed by a plurality of serially vertically contiguous regions in a substrate, and connected between said main terminals for carrying load current when biased into conduction by base drive current, and being non-conductive in the absence of said base drive current whereby said device is OFF;

regenerative switching means formed by a plurality of serially laterally contiguous regions in said substrate one of which is a gate region connected to said control terminal, said regenerative switching means being connected in parallel with said non-regenerate switching means between said main terminals for carrying current when gated into conduction by said signal current of said one polarity applied to said control terminal, and remaining conductive upon removal of said signal current because of regenerative loop current flowing through said regenerative switching means between said main terminals;

said non-regenerative switching means having a base region connected to said regenerative switching means such that part of said regenerative loop current flows to said base region to sustain conduction of said non-regenerative switching means, whereby said device is ON, said device in said ON state carrying high capacity load current through said non-regenerative switching means between said main terminals, and carrying a small low level holding current through said regenerative switching means between said main terminals, said holding current being of sufficient magnitude to maintain said regenerative loop and also to supply sufficient base drive current to sustain said non-regenerative switching means conductive;

said device being easily turned OFF by a small signal current of opposite polarity applied to said control terminal, which readily renders said regenerative switching means non-conductive because of the low level of said holding current, whereby said base drive current is terminated and said non-regenerative switching means is thus rendered non-conductive and hence terminates load current between said main terminals, whereby there is provided the combination of a lateral low level regenerative loop, afforded by said regenerative switching means, controlling a vertical higher current carrying capacity, afforded by said non-regenerative switching means, in order to achieve high turn-off gain by breaking the regenerative loop with a small signal, said non-regenerative switching means comprises a power transistor formed by first, second and third regions of alternating conductivity type;

said regenerative switching means comprises a thyristor formed by first, second, third and fourth regions of alternating conductivity type;

said first, second and third regions of said transistor are common with said second, third and fourth regions, respectively, of said thyristor;

said first region of said thyristor is disposed on a top surface of said substrate and is ohmically connected to one of said main terminals; and said common fourth region of said thyristor and third region of said power transistor is disposed on said top surface of said substrate and is ohmically connected to the other of said main terminals, and has a laterally extended dimension to provide resistance in the lateral parallel circuit branch containing said thyristor whereby to force most of said load current through the other vertical parallel circuit branch containing said power transistor when said device is in said ON state.

2. The invention according to claim 1, wherein;

said non-regenerative switching means further comprises a diode formed by first and second regions of alternating conductivity type in series with said power transistor and separated therefrom by a region of said substrate, said first diode region being disposed on a bottom surface of said substrate and ohmically connected to said one main terminal, said last mentioned separating substrate region preventing vertical regenerative action between said diode and said transistor.

3. The invention according to claim 2 formed by the following vertically aligned regions in said substrate, from bottom to top:

said first diode region of one conductivity type;

said second diode region of opposite conductivity type;

said separating substrate region of differently doped said opposite conductivity type to enable low transistor saturation resistance and also provide low minority carrier lifetime to block vertical regenerative action;

said common first transistor region and second thyristor region of said opposite conductivity type;

said common second transistor region and third thyristor region of said one conductivity type; and said common third transistor region and fourth thyristor region of said opposite conductivity type;

and also formed by the following laterally aligned regions in said substrate, each having at least a portion disposed on said top surface;

said first thyristor region of said one conductivity type;

said common second thyristor region and first transistor region of said opposite conductivity type;

said common third thyristor region and second transistor region of said one conductivity type ohmically connected to said control terminal; and said common fourth thyristor region and third transistor region of said opposite conductivity type.

* * * * *